(12) United States Patent
Ivanov

(10) Patent No.: US 6,198,296 B1
(45) Date of Patent: Mar. 6, 2001

(54) BRIDGE SENSOR LINEARIZATION CIRCUIT AND METHOD

(75) Inventor: Michael V. Ivanov, Tucson, AZ (US)

(73) Assignee: Burr-Brown Corporation, Tucson, AZ (US)

(*) Notice: Subject to any disclaimer, the term of this patent is extended or adjusted under 35 U.S.C. 154(b) by 0 days.

(21) Appl. No.: 09/231,175

(22) Filed: Jan. 14, 1999

(51) Int. Cl.[7] .......................... G01R 17/10; G01R 35/00; G01D 18/00; H01H 83/08

(52) U.S. Cl. .......................... 324/725; 324/601; 702/86; 307/131

(58) Field of Search .................... 324/706, 705, 324/601, 720, 725; 374/173, 174; 702/85, 86; 307/131

(56) References Cited

U.S. PATENT DOCUMENTS

| | | | |
|---|---|---|---|
| 3,568,044 | 3/1971 | Elazar | 323/75 |
| 3,603,147 | 9/1971 | Dorman | 73/204 |
| 3,688,581 | 9/1972 | Le Quernec | 73/362 |
| 4,068,166 | 1/1978 | Pichon | 324/62 |
| 4,190,796 | 2/1980 | Ishii | 323/75 |
| 4,202,218 | 5/1980 | Romo | 73/766 |
| 4,229,692 | 10/1980 | Graeme | 324/62 |
| 4,362,060 | 12/1982 | Okayama et al. | 73/708 |
| 4,419,620 | 12/1983 | Kurtz et al. | 323/280 |
| 4,492,122 | 1/1985 | Dimeff | 73/708 |
| 4,528,499 | 7/1985 | Traub | 324/62 |
| 4,562,731 | 1/1986 | Nishimura et al. | 73/202 |
| 4,618,818 | 10/1986 | Horn | 324/62 |
| 4,800,759 | 1/1989 | Hirata et al. | 73/708 |

(List continued on next page.)

FOREIGN PATENT DOCUMENTS

| | | | |
|---|---|---|---|
| 3634854 | 4/1988 | (DE) | . |
| 1544084 | 4/1979 | (GB) | 324/706 |

OTHER PUBLICATIONS

"Linear unbalanced dc bridge" by A. J. Rostocki and R. Wisniewski, Rev. Sci. Instrum., vol. 48, No. 6, Jun. 1977, pp. 710–711.

"Automatic Resistor Testing" by A. E. Malaccorto and C. A. Tully, IBM Technical Disclosure Bulletin, vol. 8, No. 9, Feb. 1966, pp. 1195–1196.

XTR105 4 20mA Current Transmitter with Sensor Excitation and Linearization, Burr–Brown Corporation, 1997, pp. 1–15.

Primary Examiner—Safet Metjahic
Assistant Examiner—Anjan K Deb
(74) Attorney, Agent, or Firm—Cahill, Sutton & Thomas P.L.C.

(57) ABSTRACT

A linearization circuit includes a sensor circuit having a first terminal receiving an excitation voltage, and second and third terminals producing a sensor output voltage therebetween. A differential amplifier circuit produces a linearization current, and a scaling circuit operates to produce a scaled linearization current in response to the linearization current. A current direction switch circuit includes a fourth terminal receiving the scaled linearization current, a fifth terminal and conducting a correction current proportional to the linearization current, and a control terminal receiving a polarity control signal to determine the direction of flow of the correction current through the fifth terminal in response to the sensor output voltage. An amplifier circuit receives and amplifies a reference voltage to produce the excitation voltage, the amplifier circuit including a feedback circuit, the feedback circuit being coupled to the fifth terminal and modulating the feedback circuit in response to the correction current to cause the amplifier circuit to produce the excitation voltage equal to the reference voltage plus or minus a positive or negative correction, respectively, according to the level of the polarity control signal and according to the magnitude of the sensor output voltage.

22 Claims, 4 Drawing Sheets

U.S. PATENT DOCUMENTS

| | | | |
|---|---|---|---|
| 4,807,470 | 2/1989 | Kleinhans | 73/204.15 |
| 5,055,269 | 10/1991 | Palumbo et al. | 422/96 |
| 5,063,352 | 11/1991 | Kleinhans | 324/706 |
| 5,122,756 | 6/1992 | Nelson | 324/706 |
| 5,181,420 | 1/1993 | Suzuki et al. | 73/204.15 |
| 5,189,362 | 2/1993 | Doble | 324/106 |
| 5,222,395 | 6/1993 | Matubara et al. | 73/204.18 |
| 5,345,184 | 9/1994 | Andoh | 324/720 |
| 5,753,815 | 5/1998 | Murata | 73/204.15 |
| 5,764,067 | 6/1998 | Rastegar | 324/725 |
| 5,770,965 | 6/1998 | Gritt et al. | 327/349 |

US 6,198,296 B1

BRIDGE SENSOR LINEARIZATION CIRCUIT AND METHOD

BACKGROUND OF THE INVENTION

The invention relates to a circuit for precisely correcting positive and negative linearity errors of a voltage-excited bridge sensor by a technique utilizing a minimum amount of circuitry and a minimum number of external package leads.

Resistive bridge circuits, i.e., bridge sensors, have non-linearities due to mismatches in values of the bridge circuit elements. Many bridge sensors are inherently non-linear. It is possible to compensate for such non-linearity by varying the bridge excitation voltage proportionally to the output unbalance signal of the bridge. The following equation represents the bridge excitation voltage $V_{EXCITE}$:

$$V_{EXCITE} = V_{EXCITE(0)} \pm V_{BROUT} \times K_{LIN}, \quad \text{(Equation 1)}$$

where $V_{BROUT}$ is the bridge circuit output voltage, $K_{LIN}$ is a linearization constant, and $V_{EXCITE(0)}$ is an initial value of $V_{EXCITE}$.

The uncorrected signal results in a non-linear curve for $V_{BROUT}$, as indicated by curve A in FIG. 5. Curve B in FIG. 5 represents the usually parabolic relative non-linearity of the bridge transducer that results in the nonlinear output of the bridge circuit indicated by curve A. Curve C represents the non-linearity after correction or linearization by varying the excitation voltage $V_{EXCITE}$, and curve D represents the corrected bridge output voltage obtained as a result of correcting the excitation voltage by means of a feedback circuit coupled between the bridge output and $V_{EXCITE}$.

A very effective technique for "linearizing" a bridge circuit is to modulate its "excitation source", i.e., the reference voltage which is applied to the bridge circuit. U.S. Pat. Nos. 4,190,796, 4,362,060, 4,492,122, 5,122,756 and 5,764,067 are illustrative of the state of the art. The known linearization circuits generally are used in conjunction with conventional instrumentation amplifiers which provide amplified outputs to suitable utilization circuits.

The above mentioned known linearization circuits generally require four external package leads to allow a user to determine both the polarity and magnitude of linearity corrections required for each individual bridge sensor circuit. However, the user often has no way of knowing in advance whether the polarity of linearity correction needed for a particular bridge sensor circuit is positive or negative. Consequently, the user may have to swap connections between two external leads of the bridge linearization circuit to get the correct polarity of linearization correction, which is inconvenient. Furthermore, it usually is undesirable to have to use more external package leads than is genuinely necessary, and it would be better to be able to adjust the magnitude of the needed correction with one, rather than two external package leads.

Accordingly, there is an unmet need for an improved bridge linearity correction technique which requires a reduced amount of circuitry and a reduced number of external package leads for setting both the polarity and magnitude of the linearity corrections required for each different bridge sensor.

SUMMARY OF THE INVENTION

Accordingly, it is an object of the invention to provide a bridge sensor linearization circuit and technique for providing a correction to the excitation voltage of a bridge sensor circuit using a reduced number of circuit components.

It is another object of the invention to provide a bridge linearization circuit and technique for providing a correction in the bridge excitation voltage of the desired polarity and magnitude requiring only two external package leads, one to select the polarity of the needed correction and the other to establish the magnitude of the needed correction.

It is another object of the invention to avoid the need to swap package lead connections to establish the correct polarity of a correction to a bridge excitation voltage produced by a linearization circuit.

It is another object of the invention to avoid the need for a user to construct "build-your-own" circuitry to obtain the needed linearization of a bridge sensor circuit.

It is another object of the invention to avoid dependance of the linearization constant $K_{LIN}$ on variations of absolute resistances of on-chip integrated circuit resistors.

Briefly described, and in accordance with one embodiment thereof, the invention provides a linearization circuit including a sensor circuit having a first terminal receiving an excitation voltage, and second and third terminals producing a sensor output voltage therebetween, a differential amplifier circuit coupled to the second and third terminals and producing a linearization current in response to the sensor output voltage, a current direction switch circuit producing a bi-directional correction current proportional to the linearization current, the current direction switch circuit having a fourth terminal receiving the linearization current, a fifth terminal conducting the correction current, and a control terminal receiving a polarity control signal to determine the direction of flow of the correction current through the fifth terminal in response to the sensor output voltage, and an amplifier circuit receiving and amplifying a reference voltage to produce the excitation voltage. The amplifier circuit includes a feedback circuit, the feedback circuit being coupled to the fifth terminal and modulating the feedback circuit in response to the correction current to cause the amplifier circuit to produce the excitation voltage equal to the reference voltage plus or minus a positive or negative correction, respectively, according to the level of the polarity control signal and according to the magnitude of the sensor output voltage.

In one embodiment, the linearization circuit includes a scaling circuit operative to produce a scaled linearization current in response to the linearization current. The linearization circuit includes a first resistor coupled to the fifth terminal to develop a voltage change on the fifth terminal proportional to the correction current, and further includes a band gap circuit producing the reference voltage. The amplifier circuit includes a differential amplifier having an output coupled to the first terminal, and a feedback resistor coupled between an inverting input of the differential amplifier and the output of the differential amplifier, the inverting input being coupled to the fifth terminal, a non-inverting input of the differential amplifier being coupled to receive the reference voltage. In one embodiment, the current direction switch circuit includes a first switch operatively connecting the fourth terminal to the fifth terminal during a first level of the polarity control signal to conduct the scaled linearization current as the correction current in a first direction through the fifth terminal. A current mirror, a second switch operatively conducts the scaled linearization current through a current mirror control transistor of the current mirror during a second level of the polarity control signal, and a current mirror output transistor of the current mirror producing a replica of the scaled linearization current as the correction current flowing in a second direction through the fifth terminal.

In one embodiment of the invention, the differential amplifier circuit includes a first operational amplifier having a non-inverting input coupled to the second terminal, an output coupled to a control terminal of a first output transistor having a first main terminal coupled to a first output conductor and a second main terminal coupled to an inverting input of the first operational amplifier. The inverting input of the first operational amplifier is coupled to a first terminal of a transconductance control resistor. A second operational amplifier includes an inverting input coupled to a second terminal of the transconductance control resistor and to a first main terminal of a second output transistor having a control terminal coupled to an output of the second operational amplifier. The second operational amplifier has a non-inverting input coupled to the third terminal.

In one embodiment, the scaling circuit includes an external first resistor coupled between a first external package lead and an external supply voltage. A first differential amplifier includes a non-inverting input coupled to the first external package lead, an inverting input coupled to a first terminal of a second resistor and a first terminal of a transistor having a control terminal coupled to the output of the first differential amplifier. A terminal of the transistor supplies the scaled linearization current through the fourth terminal into the current direction switch circuit, a second terminal of the second resistor being coupled to the external supply voltage.

In one embodiment, the scaling circuit includes an MDAC operative to generate the scaled linearization current in response to the linearization current with a scale factor determined by a programmable controller circuit.

DETAILED DESCRIPTION OF THE PREFERRED EMBODIMENTS

Figure 1:
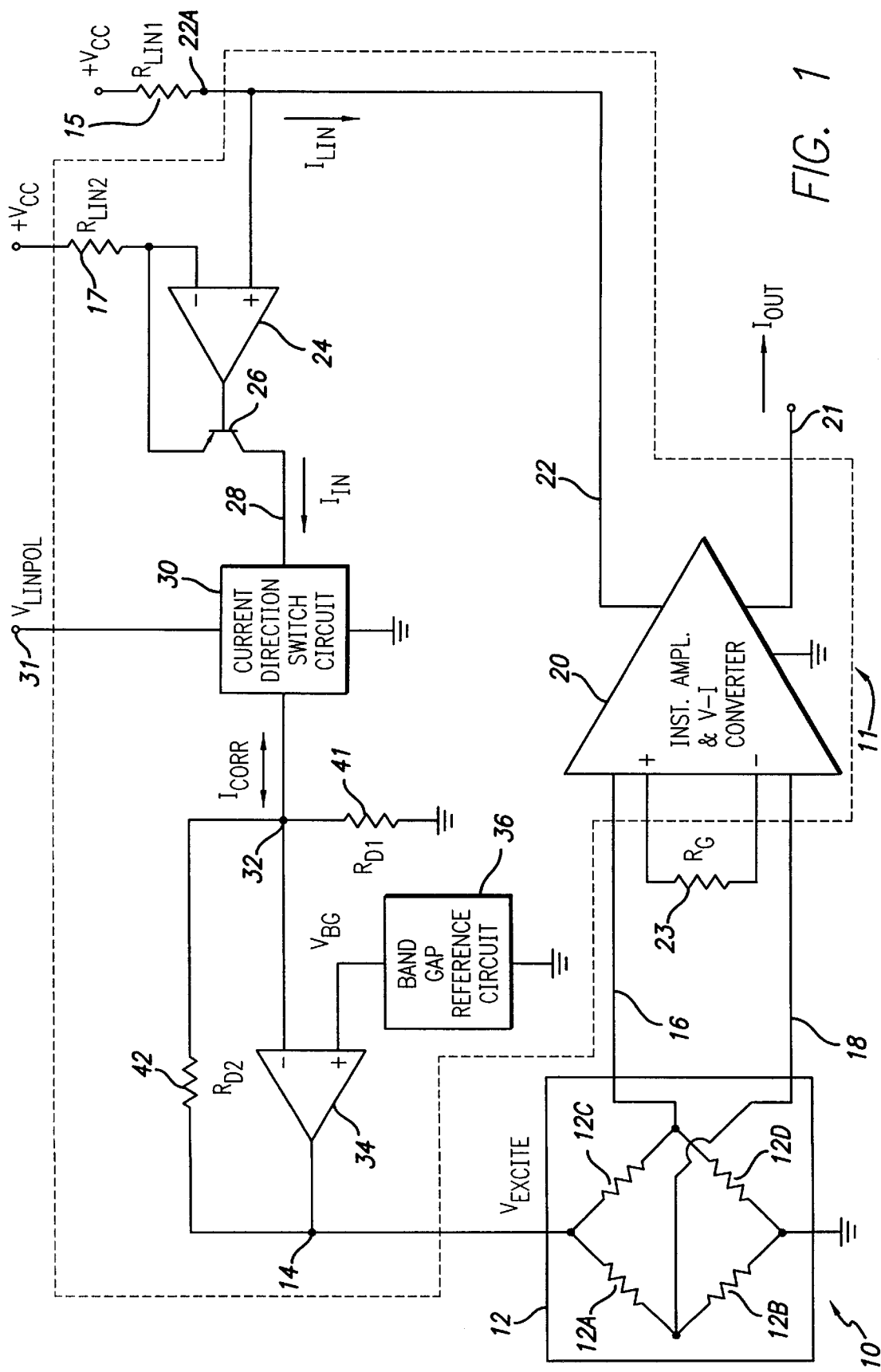
FIG. 1 is a detailed block diagram of a bridge linearization circuit connected to a bridge sensor circuit.

Referring to FIG. 1, bridge linearization circuit 10 includes a bridge sensor circuit 12, which typically converts an analog quantity such as pressure, strain displacement, light intensity or the like into a low level analog voltage. Bridge sensor circuit 12 typically includes a left arm including resistive elements 12A and 12B and a right arm including resistor elements 12C and 12D. One or both of resistive elements 12A and 12B may be a transducer element. Resistive elements 12A and 12C are connected to conductor 14 on which a "bridge excitation voltage" $V_{EXCITE}$ is produced and modulated in accordance with the present invention. The junction between resistive elements 12A and 12B is connected to conductor 18, and the junction between resistive elements 12C and 12D is connected to conductor 16. The junction between resistive elements 12B and 12D is connected to ground. The excitation voltage $V_{EXCITE}$ is applied to bridge sensor circuit 12 through conductor 14. The two outputs 16 and 18 of bridge sensor 12 are at identical voltages when bridge circuit 12 is balanced.

Alternatively, bridge sensor circuit 12 can be a piezo-resistive semiconductor element which is biased similarly to bridge sensor circuit 12 and produces a similar differential output signal. Therefore, the linearization circuit of the present invention can also correct the non-linearity of such a piezo-resistive semiconductor element.

Bridge output conductors 16 and 18 are connected to the (+) and (−) inputs, respectively, of an instrumentation voltage-to-current converter 20 included in an integrated linearization circuit within dashed line 11. Instrumentation voltage-to-current converter 20 includes two external gain adjustment inputs across which a gain adjusting resistor 23 of resistance $R_G$ is connected to determine the transconductance of instrumentation voltage-to-current converter 20.

Instrumentation voltage-to-current converter 20 produces two essentially equal output currents, including a linearization current $I_{LIN}$ flowing through conductor 22 and an output current $I_{OUT}$ which flows out of conductor 21 to a utilization circuit (not shown). Linearization current $I_{LIN}$ flows from external integrated circuit package lead 22A through conductor 22. $I_{LIN}$ and $I_{OUT}$ are proportional to the voltage difference between conductors 16 and 18 if the bridge sensor circuit 12 is unbalanced. $I_{LIN}$ flows from $+V_{CC}$ into external package lead 22A through an external resistor 15 of resistance $R_{LIN1}$, producing a corresponding voltage on the (+) input of a simple differential amplifier 24. The (−) input of amplifier 24 is connected to one terminal of an internal resistor 17 of resistance $R_{LIN2}$, the other terminal of which is connected to $+V_{CC}$. The (−) input of amplifier 24 also is connected to the emitter of a PNP transistor 26. The output of amplifier 24 is connected to the base electrode of PNP transistor 26. The collector of PNP transistor 26 is connected to conductor 28, through which a scaled linearization current $I_{IN}$ flows. By suitably ratioing $R_{LIN1}$ and $R_{LIN2}$, $I_{IN}$ can be scaled relative to $I_{LIN}$ to accommodate different ranges of magnitudes of non-linearity errors of bridge sensor circuit 12.

Thus, the current $I_{LIN}$ generated in the output conductor 22 of instrumentation voltage-to-current converter 20 is scaled according to the ratio of $R_{LIN1}$ to $R_{LIN2}$ to produce the scaled linearization current $I_{IN}$. The direction of $I_{IN}$ then is either reversed or not reversed, according to the level of polarity control signal $V_{LINPOL}$, by a current direction switch circuit 30 to produce a bi-directional correction current $I_{CORR}$. $I_{CORR}$ then is injected into the voltage divider formed by internal resistors 41 and 42 of resistances $R_{D1}$ and $R_{D2}$, respectively. This voltage divider modulates the initial value $V_{EXCITE(0)}$ of the excitation voltage $V_{EXCITE}$ proportionally to the output current $I_{LIN}$ of instrumentation voltage-to-current converter 20. Therefore, the value of the linearization constant $K_{LIN}$ of Equation (1) is given by the expression $$K_{LIN} = \frac{R_{LIN1} \times R_{D2}}{R_G \times R_{LIN2}}. \qquad \text{(Equation 2)}$$

Since $R_{LIN1}$ and $R_G$ are external to the integrated circuit indicated by dashed line 11, the linearization constant $K_{LIN}$ becomes independent of variations in the values of the resistors $R_{D1}$, $RD_2$, and $R_{LIN2}$ formed in an integrated circuit including the circuitry shown within dashed line 11. The accuracy $K_{LIN}$ therefore is determined by the matching of $R_{LIN2}$ and $R_{D2}$.

Figure 1A:
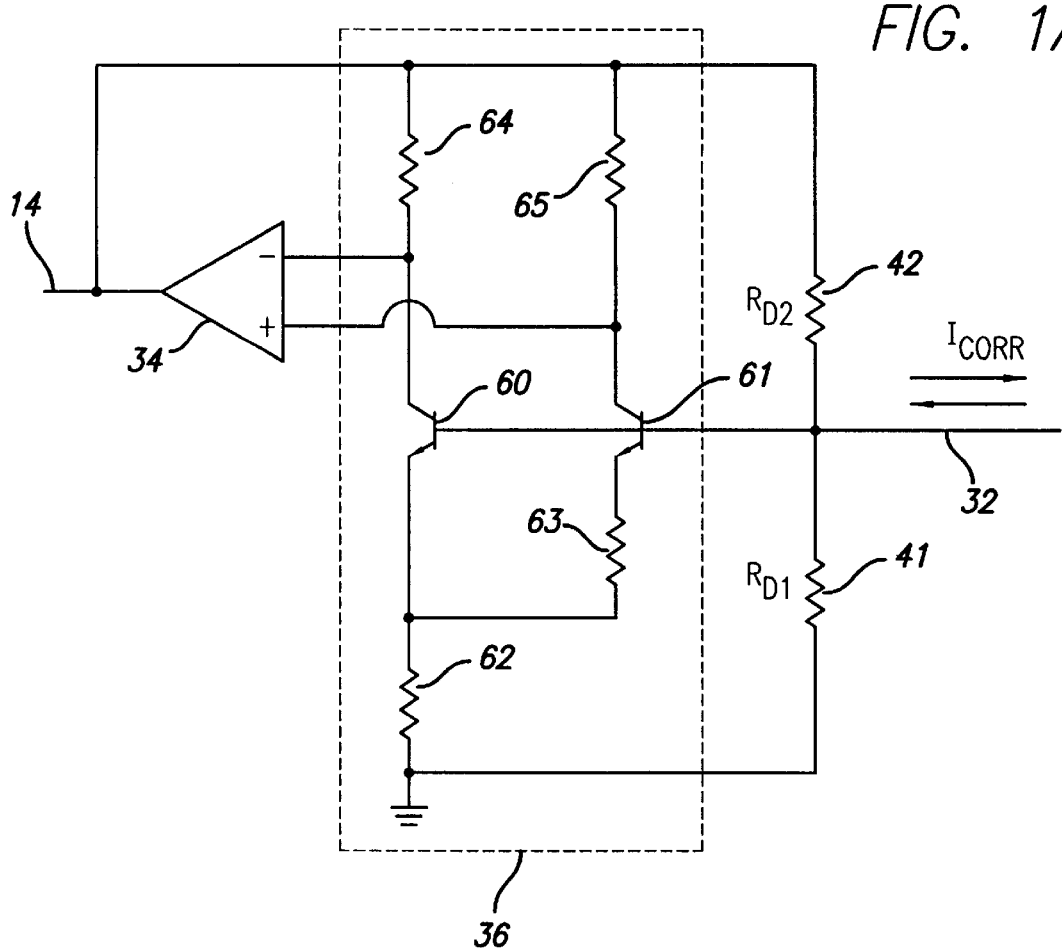
FIG. 1A is a schematic diagram of the band gap reference circuit 36 and its connection to amplifier 34 in FIG. 1.

The current direction switch circuit 30 allows the user to conveniently set the polarity sign in Eq. 1 above to compensate both positive and negative "bows" of the nonlinearity of bridge sensor circuit 12. Specifically, $I_{IN}$ flows into current direction switch circuit 30 to produce correction current $I_{CORR}$ so it flows either into or out of a conductor 32 of a feedback circuit $R_{D2}$, 60, 61 (subsequently described) of a differential amplifier 34, the output of which produces $V_{EXCITE}$. The direction of $I_{CORR}$ is controlled by the signal $V_{LINPOL}$ on external package lead 31. If $V_{LINPOL}$ is connected to $+V_{CC}$, $I_{CORR}$ flows into conductor 32, which is connected to the junction between resistors $R_{D1}$ and $R_{D2}$. Conductor 32 also is coupled (for example, as shown in FIG. 1A) to the (−) input of differential amplifier 34, which also has an input connected to a band gap reference voltage circuit 36. The correction current $I_{CORR}$ flowing into the feedback circuit of amplifier 34 causes a modulation of $V_{EXCITE}$ according to the magnitude and polarity of $I_{CORR}$. If $V_{LINPOL}$ is at $+V_{CC}$ volts, the excitation voltage $V_{EXCITE}$ on conductor 14 decreases slightly so as to compensate for a non-linearity in bridge sensor circuit 12. If the signal $V_{LINPOL}$ on external package lead 31 is connected to ground, then the correction current $I_{CORR}$ flows out of conductor 32, causing the excitation voltage $V_{EXCITE}$ on conductor 14 to be increased slightly so as to correct the nonlinearity of bridge sensor 12.

Thus, the excitation voltage of bridge sensor circuit 12 is equal to a band gap voltage produced by band gap reference voltage circuit 36, but slightly increased or slightly decreased in proportion to the error voltage between bridge sensor circuit output conductors 16 and 18.

FIG. 1A more accurately shows the details of a conventional Browkaw band gap circuit 36 and the connection of its differential output between the (+) and (−) inputs of differential amplifier 34. Band gap circuit 36 includes an NPN transistor 60 having its emitter connected to the upper terminal of a resistor 62, the lower terminal of which is connected to ground. The collector of transistor 60 is connected to the (−) input of differential amplifier 34 and to one terminal of a load resistor 64, the other terminal of which is connected to conductor 14. The base of transistor 60 is connected to conductor 32 and the base of an NPN transistor 61 having a substantially larger emitter area than transistor 60. The base of transistor 61 also is connected to conductor 32. The emitter of transistor 61 is coupled by resistor 63 to the emitter of transistor 60, so that a voltage difference proportional to absolute temperature is developed across resistors 62 and 63. The collector of transistor 61 is connected to the (+) input of differential amplifier 34 and to one terminal of load resistor 65, the other terminal of which is connected to conductor 14.

Figure 3:
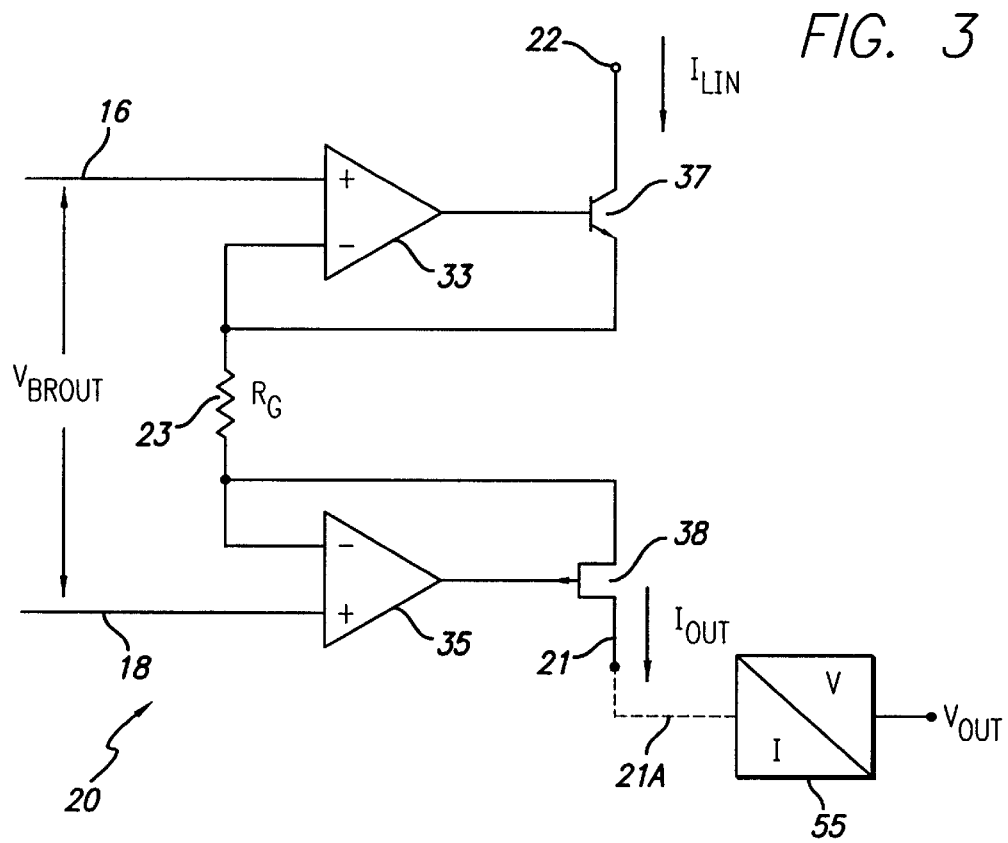
FIG. 3 is a schematic diagram of an instrumentation voltage-to-current converter in the bridge linearization circuit of FIG. 1.

The details of instrumentation voltage-to-current converter 20 are shown in FIG. 3, wherein bridge sensor circuit output conductor 16 is connected to the non-inverting input of an operational amplifier 33, the output of which is connected to the base of an NPN transistor 37. The emitter of transistor 37 is connected to the inverting input of operational amplifier 33 and to one terminal of the external transconductance-setting resistor $R_G$. The other terminal of resistor $R_G$ is connected to the inverting input of an operational amplifier 35 and to the source of a P-channel JFET (junction field effect transistor) 38. The gate electrode of JFET 38 is connected to the output of operational amplifier 35. Bridge sensor circuit output conductor 18 is connected to the inverting input of operational amplifier 35.

The collector of transistor 37 is connected to conductor 22, so linearization current $I_{LIN}$ flows through conductor 22, NPN transistor 37, resistor $R_G$, and JFET 38. The drain of JFET 38 is connected to conductor 21, so the output current $I_{OUT}$, (which is essentially equal to $I_{LIN}$) flows out of conductor 21 into a utilization circuit. (If the user desires a voltage output rather than a current output from the circuit 10 of FIG. 1, a conventional current-to-voltage converter circuit 55 can be coupled as indicated by dashed line 21A in FIG. 3 to conductor 21 to convert $I_{OUT}$ to an output voltage $V_{OUT}$ that represents the analog quantity sensed by bridge sensor circuit 12.) The configuration of instrumentation voltage-to-current converter 20 shown in FIG. 3 is conventional, being similar to the instrumentation amplifier in the assignee's XTR105 bridge linearization circuit.

Figure 2:
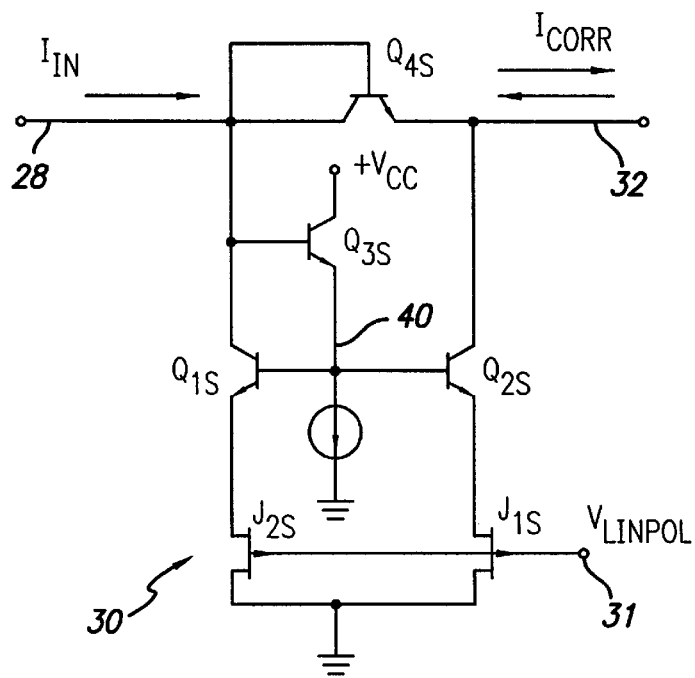
FIG. 2 is a schematic circuit diagram of a current direction switch circuit used in the bridge linearization circuit of FIG. 1.

The details of one implementation of current direction switch circuit 30 of FIG. 1 are shown in FIG. 2. In current direction switch circuit 30, if the two JFETs $J_{1S}$ and $J_{2S}$ are turned on by setting $V_{LINPOL}$ to ground, diode-connected transistor $Q_{4S}$ is turned off and $I_{IN}$ flows into the collector of transistor $Q_{1S}$, and therefore is mirrored into the collector of transistor $Q_{2S}$. Therefore, the correction current $I_{CORR}$, in effect, flows from conductor 32 into the collector of transistor $Q_{2S}$. However, if the value of $V_{LINPOL}$ is set to $+V_{CC}$, this turns JFETs $J_{1S}$ and $J_{2S}$ off, and $I_{IN}$ flows through diode-connected transistor $Q_{4S}$, so $I_{CORR}$ flows from the emitter of $Q_{4S}$ into conductor 32.

Figure 4:
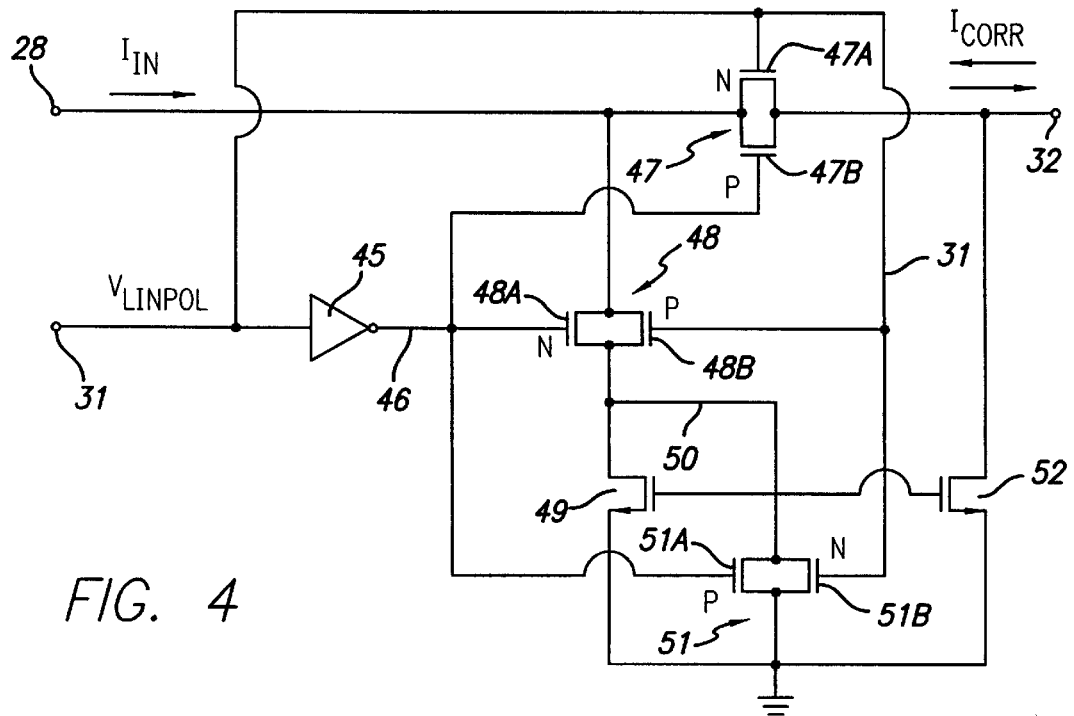
FIG. 4 is a schematic diagram of a CMOS current direction switch which can be used in the bridge linearization circuit of FIG. 1.
Figure 5:
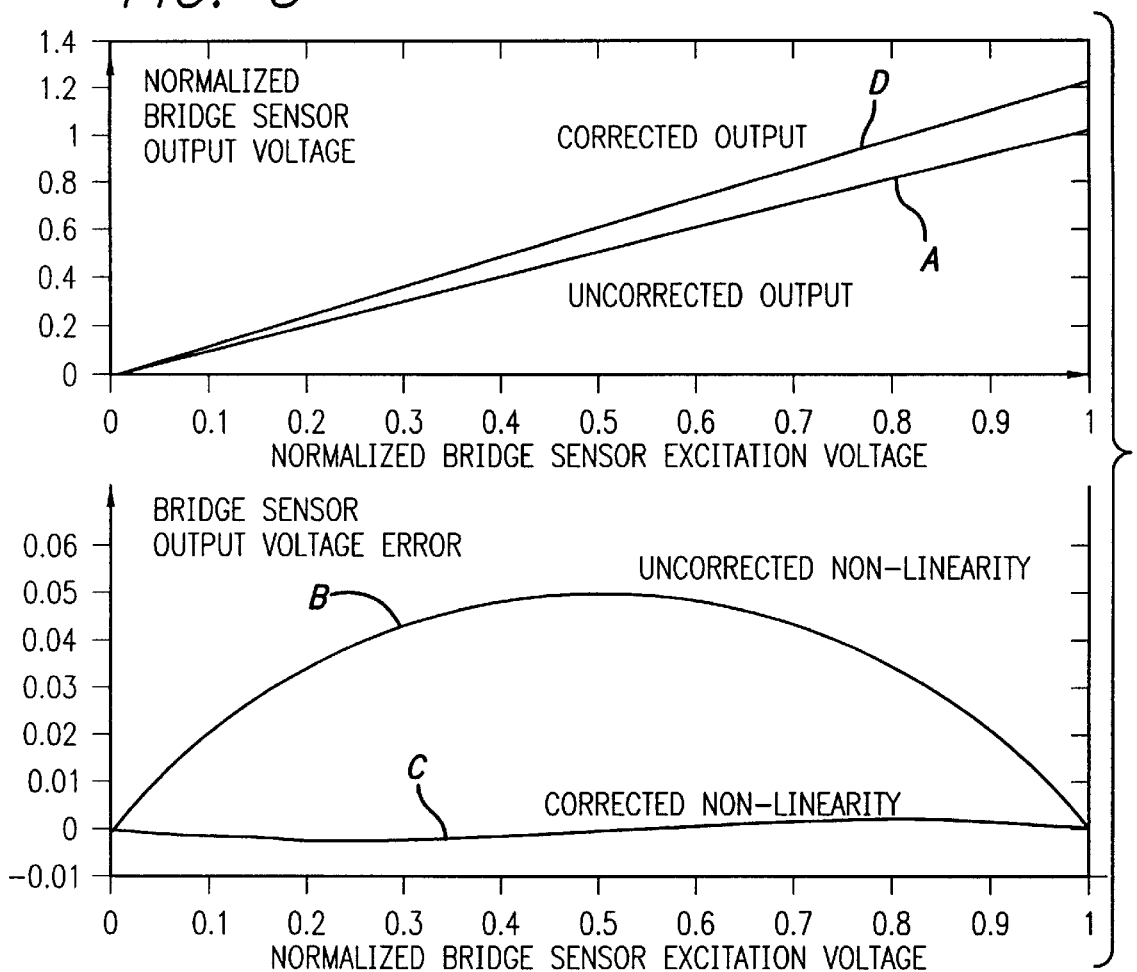
FIG. 5 is a graph useful in explaining operation of the bridge linearization circuit of FIG. 1.

FIG. 4 shows a CMOS implementation 30A of the current direction switch circuit 30 of FIG. 1. If $V_{LINPOL}$ is set at $+V_{CC}$ volts, the linearization current $I_{IN}$ in conductor 28 flows through a CMOS transmission gate 47 including N-channel MOSFET 47A and P-channel MOSFET 47B both connected between conductors 28 and 32 to generate the correction current $I_{CORR}$, which flows out of terminal 32. This is because CMOS transmission gate 47 is turned on as a result of setting $V_{LINPOL}$ at $+V_{CC}$ volts. A CMOS transmission gate 48, including N-channel MOSFET 48A and P-channel MOSFET 48B both connected between conductors 28 and 50, is turned off, and a second CMOS transmission gate 51 (including P-channel MOSFET 51A and N-channel MOSFET 51B both connected between conductor 50 and ground) is turned on. An N-channel MOSFET 49 is connected between conductor 50 and ground. The drain and gate of MOSFET 49 are connected to conductor 50, which is also connected to the gate of an N-channel MOSFET 52 having its drain connected to conductor 32 and its source connected to ground.

In the circuit of FIG. 4, the logical complement of $V_{LINPOL}$ needed to operate CMOS transmission gates 47, 48 and 51 is generated on conductor 46 by a CMOS inverter 45 having its input connected to conductor 31. Thus, $V_{LINPOL}$ is applied to the gate electrodes of N-channel MOSFET 47 A, P-channel MOSFET 482, and N-channel MOSFET 51B, and the logical complement of $V_{LINPOL}$ is applied by conductor 46 to the gates of P-channel MOSFET 47B, N-channel MOSFET 48A, and P-channel MOSFET 51A.

If $V_{LINPOL}$ is set to ground volts in the circuit of FIG. 4, transmission gates 47 and 51 are turned off and transmission gate 48 is turned on. This causes N-channel current mirror MOSFET 52 to be turned on and to therefore conduct a current which is a "mirrored" replication of the scaled linearization current $I_{IN}$ This mirrored current becomes the correction current $I_{CORR}$, flowing into conductor 32 through N-channel MOSFET 52 to ground.

One advantage of the circuit of FIG. 1 is that only one external lead of the integrated circuit 11 incorporating the linearization circuit is required to set the polarity of the correction current $I_{CORR}$, that lead being connected to conductor 31. The amount of linearization can be scaled by selecting/adjusting the resistance of external resistor $R_{LIN1}$.

Another advantage of the circuit of FIG. 1 is that since $R_{LIN1}$ is external, its value is independent of on-chip variation in the values of the other resistors, all of which are included on the integrated circuit chip 11. Note that in Equation (2), $R_{LIN1}$ and $R_G$ both are external, and $R_{D2}$ and $R_{LIN2}$ both are on-chip and therefore have the same variation with processing parameters, etc.

A important advantage of the circuit shown in FIG. 1 is that no separate external instrumentation amplifier need be provided by the user, whereas in most applications of a bridge linearization circuit a separate external instrumentation amplifier must be supplied by the user to amplify the bridge output voltage into a useful signal useful for a utilization circuit. Instrumentation amplifiers generally are complex, expensive precision circuits. Furthermore, prior linearization schemes for bridge sensors typically have also required two available leads to adjust the gain of the linearization circuit and another two available leads to set the direction of the correction current to alter the polarity of the modulation of the bridge excitation voltage. The above described linearization circuit provides an economical, single-chip linearization solution wherein no separate instrumentation amplifier is required, and wherein the user needs only to (1) select a suitable value of external resistor $R_{LIN1}$ to scale the linearization current $I_{LIN}$, and (2) supply a suitable logical level for $V_{LINPOL}$ to set the polarity of the correction. Furthermore, only one external lead of the linearization circuit is needed for setting the magnitude of the correction and only one other external lead is needed for setting the polarity of the correction.

By using the output signal of the instrumentation voltage-to-current converter 20 in the form of a linearization current for correcting the bridge excitation voltage $V_{EXCITE}$, and by using simple differential amplifier with an external precision resistor $R_{LIN1}$ connected between $+V_{CC}$ and external package terminal 22A, and by providing a current direction switch circuit 30 requiring only one external package lead 31 to control the polarity of the internal correction current $I_{CORR}$ and hence the polarity of the modulation of $V_{EXCITE}$, the total amount of required circuitry is reduced, because no external instrumentation amplifier is needed.

Thus, the described bridge sensor linearization circuit provides the user with superior precision, lower product cost, and a smaller package than the prior art, and allows the user to avoid the need for and cost of providing "build-your-own" linearization circuits, which has been a common practice.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention.

Figure 6:
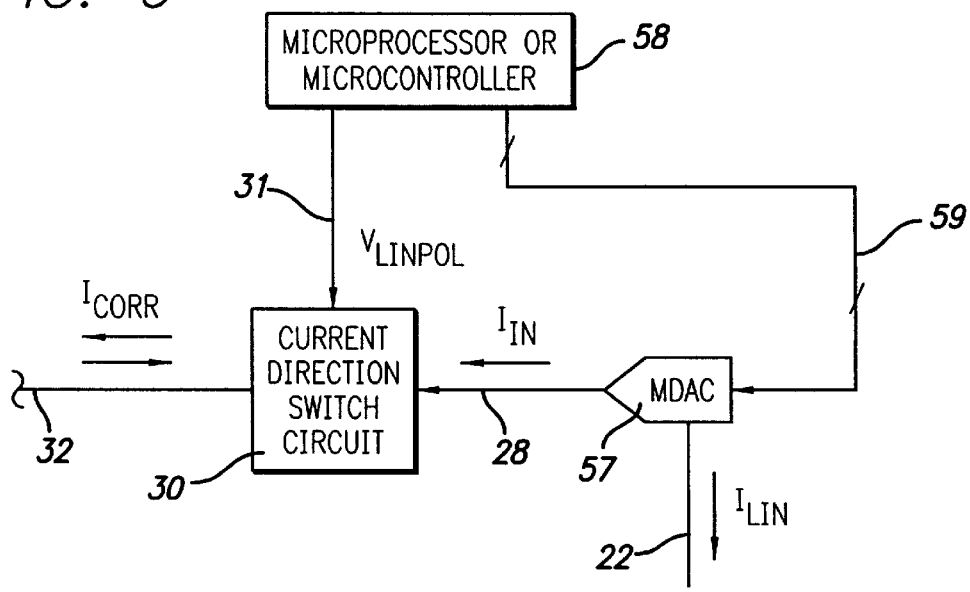
FIG. 6 is a block diagram of an alternative implementation of the system of FIG. 1 utilizing a microprocessor to control scaling of and polarity of the linearization current.

For example, the scaled linearization current $I_{IN}$ can be produced by a conventional MDAC (multiplying digital-to-analog converter) as indicated by numeral 57 in FIG. 6. A microprocessor or microcontroller circuit 58 could be programmed to provide digital control data 59 to control the scaling of $I_{IN}$ (relative to $I_{LIN}$) by MDAC 57. Microprocessor circuit 58 also could produce the polarity control signal $V_{LINPOL}$ on conductor 31 of current direction switch circuit 30. The technique of FIG. 6 would be well suited to use with a CMOS implementation of the linearization circuit as shown in FIG. 4.

What is claimed is:

1. A linearization circuit comprising:
   (a) a sensor circuit including a first terminal receiving an excitation voltage, and second and third terminals producing a sensor output voltage therebetween;
   (b) a differential amplifier circuit coupled to the second and third terminals and producing a linearization current in response to the sensor output voltage;
   (c) a current direction switch circuit producing a bi-directional correction current proportional to the linearization current, the current direction switch circuit having a fourth terminal receiving the linearization current, a fifth terminal conducting the correction current, and a control terminal receiving a polarity control signal to determine the direction of flow of the correction current through the fifth terminal in response to the sensor output voltage; and
   (d) an amplifier circuit receiving and amplifying a reference voltage to produce the excitation voltage, the amplifier circuit including a feedback circuit, the feedback circuit being coupled to the fifth terminal and modulating the feedback circuit in response to the correction current to cause the amplifier circuit to produce the excitation voltage equal to the reference voltage plus or minus a positive or negative correction, respectively, according to the level of the polarity control signal and according to the magnitude of the sensor output voltage.

2. A linearization circuit comprising:
   (a) a sensor circuit including a first terminal receiving an excitation voltage, and second and third terminals producing a sensor output voltage therebetween;
   (b) a differential amplifier circuit coupled to the second and third terminals and producing a linearization current in response to the sensor output voltage;
   (c) a scaling circuit operative to produce a scaled linearization current in response to the linearization current;
   (d) a current direction switch circuit producing a bi-directional correction current proportional to the linearization current, the current direction switch circuit having a fourth terminal receiving the scaled linearization current, a fifth terminal conducting the correction current, and a control terminal receiving a polarity control signal to determine the direction of flow of the correction current through the fifth terminal in response to the sensor output voltage; and
   (e) an amplifier circuit receiving and amplifying a reference voltage to produce the excitation voltage, the amplifier circuit including a feedback circuit, the feedback circuit being coupled to the fifth terminal and modulating the feedback circuit in response to the correction current to cause the amplifier circuit to produce the excitation voltage equal to the reference voltage plus or minus a positive or negative correction, respectively, according to the level of the polarity control signal and according to the magnitude of the sensor output voltage.

3. The linearization circuit of claim 2 including a first resistor coupled to the fifth terminal, the feedback circuit including a feedback resistor coupled between an output and an inverting input of the amplifier circuit, and developing a voltage change across the feedback resistor proportional to the correction current, the linearization circuit further including a band gap circuit producing the reference voltage, wherein the amplifier circuit includes a differential amplifier the band gap circuit applying the reference voltage to a non-inverting input of the differential amplifier, the differential amplifier having an output coupled to the first terminal.

4. The linearization circuit of claim 2 wherein the current direction switch circuit includes an input terminal coupled to the fourth terminal and receiving the scaled linearization current, a diode-connected transistor coupled between the input terminal and the fifth terminal, current mirror circuitry including a first transistor having a first terminal coupled to the input terminal, a control terminal coupled to the input terminal and to a control terminal of a second transistor, a first terminal of the second transistor being coupled to the fifth terminal, and first and second switch transistors each having a control terminal connected to receive the polarity control signal, the first switch transistor having a first terminal connected to a second terminal of the first transistor and a second terminal connected to a fixed reference voltage, the second switch transistor having a first terminal connected to a second terminal of the second transistor and a second terminal connected to the fixed reference voltage, wherein the scaled linearization current flows directly through the diode-connected transistor in a first direction into the fifth terminal if the polarity control signal is at a first level, and wherein the scaled linearization current is mirrored to produce the correction current in a second direction through the fifth terminal if the polarity control signal is at a second level.

5. The linearization circuit of claim 2 wherein the scaling circuit includes an MDAC coupled to a programmed controller circuit and to the differential amplifier circuit and operative to generate the scaled linearization current in response to the linearization current with a scale factor determined by the programmed controller circuit.

6. The linearization circuit of claim 5 wherein the programmed controller circuit generates the polarity control signal.

7. The linearization circuit of claim 2 wherein the current direction switch circuit includes (1) a first switch operatively connecting the fourth terminal to the fifth terminal during a first level of the polarity control signal to conduct the scaled linearization current as the correction current in a first direction through the fifth terminal, (2) a current mirror, and (3) a second switch operatively conducting the scaled linearization current through a current mirror control transistor of the current mirror during a second level of the polarity control signal, a current mirror output transistor of the current mirror producing a replica of the scaled linearization current as the correction current flowing in a second direction through the fifth terminal.

8. The linearization circuit of claim 2 wherein the differential amplifier circuit includes (1) a first operational amplifier having a non-inverting input coupled to the second terminal, (2) an output coupled to a control terminal of a first output transistor having a first main terminal coupled to a first output conductor and a second main terminal coupled to an inverting input of the first operational amplifier, the inverting input of the first operational amplifier being coupled to a first terminal of a transconductance control resistor, and (3) a second operational amplifier having an inverting input coupled to a second terminal of the transconductance control resistor and to a first main terminal of a second output transistor having a control terminal coupled to an output of the second operational amplifier, the second operational amplifier having a non-inverting input coupled to the third terminal.

9. The linearization circuit of claim 8 wherein the first output transistor is an NPN transistor having a collector connected to the first output conductor, a base connected to the output of the first operational amplifier, and wherein the second output transistor is a P-channel junction field effect transistor having a source electrode connected to the input of the second operational amplifier, and a drain electrode producing an output current proportional to the sensor output voltage.

10. The linearization circuit of claim 2 including a first external package lead, the scaling circuit including (1) an external first resistor coupled between the first external package lead and an external supply voltage, and (2) a first differential amplifier including a non-inverting input coupled to the first external package lead, an inverting input coupled to a first terminal of a second resistor and a first terminal of a transistor having a control terminal coupled to the output of the first differential amplifier, a terminal of the transistor supplying the scaled linearization current through the fourth terminal into the current direction switch circuit, a second terminal of the second resistor being coupled to the external supply voltage.

11. The linearization circuit of claim 8 including a first external package lead, the scaling circuit including (1) an external first resistor coupled between the first external package lead and an external supply voltage, and (2) a first differential amplifier including a non-inverting input coupled to the first external package lead, an inverting input coupled to a first terminal of a second resistor and a first terminal of a transistor having a control terminal coupled to the output of the first differential amplifier, a terminal of the transistor supplying the scaled linearization current through the fourth terminal into the current direction switch circuit, a second terminal of the second resistor being coupled to the external supply voltage.

12. The linearization circuit of claim 2 wherein the polarity control signal is applied to an external package lead connected to the control terminal of the current direction switch circuit.

13. The linearization circuit of claim 12 wherein the external package lead is the only external package lead utilized to establish a direction of flow of the correction current.

14. The linearization circuit of claim 10 wherein the external package lead is the only external package lead utilized to determine an amount of scaling of the scaled linearization current.

15. A linearization circuit comprising:
(a) a bridge circuit including a first terminal receiving an excitation voltage, and second and third terminals producing a bridge output voltage therebetween;
(b) an amplifier circuit including an instrumentation voltage-to-current converter including (1) a first operational amplifier having a non-inverting input coupled to the second terminal, (2) an output coupled to a control terminal of a first output transistor having a first main terminal connected to a first output conductor conducting a linearization current proportional to the bridge output voltage and a second main terminal coupled to an inverting input of the first operational amplifier, the inverting input of the first operational amplifier being coupled to a transconductance control resistor, and (3) a second operational amplifier having an inverting input coupled to a second terminal of the transconductance control resistor and to a first main terminal of a second output transistor having a control terminal connected to an output of the second operational amplifier, the second operational amplifier having a non-inverting input coupled to the third terminal; and (c) an amplifier circuit receiving and amplifying a reference voltage to produce the excitation voltage, the amplifier circuit including a feedback circuit, the feedback circuit being coupled to cause the amplifier circuit to modulate the excitation voltage in response to the linearization circuit.

16. The linearization circuit of claim 15 wherein a second main terminal of the second output transistor is connected to a second output conductor conducting an output current substantially equal to the linearization current.

17. The linearization circuit of claim 15 wherein the first output transistor is an NPN transistor having a collector connected to the first output conductor, a base connected to the output of the first operational amplifier, and wherein the second output transistor is a P-channel junction field effect transistor having a source electrode connected to the input of the second operational amplifier, and a drain electrode conducting an output current proportional to the sensor output voltage.

18. The linearization circuit of claim 15 including a current direction switch circuit coupled to receive the linearization current, wherein the current direction switch circuit includes a fourth terminal receiving the linearization current, a diode-connected transistor coupled between the fourth terminal and a fifth terminal, current mirror circuitry including a first transistor having a first terminal coupled to the fourth terminal, a control terminal coupled to the fourth terminal and to a control terminal of a second transistor, a first terminal of the second transistor being coupled to the fifth terminal, and first and second switch transistors each having a control terminal connected to receive the polarity control signal, the first switch transistor having a first terminal connected to a second terminal of the first transistor and a second terminal connected to a fixed reference voltage, the second switch transistor having a first terminal connected to a second terminal of the second transistor and a second terminal connected to the fixed reference voltage, wherein the linearization current flows directly through the diode-connected transistor in a first direction into the fifth terminal if the polarity control signal is at a first level, and wherein the linearization current is mirrored to produce the correction current in a second direction through the fifth terminal if the polarity control signal is at a second level.

19. The linearization circuit of claim 15 including a current direction switch circuit coupled to receive the linearization current, wherein the current direction switch circuit includes a fourth terminal receiving the linearization current, a first switch operatively connecting the fourth terminal to the feedback circuit through a fifth terminal during a first level of the polarity control signal to conduct the linearization current as the correction current in a first direction through the fifth terminal, a current mirror, a second switch operatively conducting the linearization current through a current mirror control transistor of the current mirror during a second level of the polarity control signal, a current mirror output transistor of the current mirror producing a replica of the scaled linearization current as the correction current flowing in a second direction through the fifth terminal.

20. The linearization circuit of claim 18 wherein the first output transistor is an NPN transistor having a collector connected to the first output conductor, a base connected to the output of the first operational amplifier, and wherein the second output transistor is a P-channel junction field effect transistor having a source electrode connected to the input of the second operational amplifier, and a drain electrode producing an output current proportional to the sensor output voltage.

21. A method of correcting non-linearity of a sensor circuit including a first terminal receiving an excitation voltage, and second and third terminals producing a sensor output voltage therebetween, comprising:

(a) producing a linearization current in response to the sensor output voltage;

(b) producing a scaled linearization current in response to the linearization current;

(c) producing the excitation voltage by amplifying a band gap voltage; and (d) modulating the excitation voltage by producing a bi-directional correction current proportional to the linearization current by conducting the scaled linearization current into a feedback circuit of an amplifier while a polarity control signal is at a first level, and by conducting a mirrored image of the scaled linearization current out of the feedback circuit if the polarity control signal is at a second level, to cause the amplifier to produce the excitation voltage equal to the band gap voltage plus or minus a positive or negative correction, respectively, according to the level of the polarity control signal and according to the magnitude of the sensor output voltage.

22. A circuit for correcting non-linearity of a sensor circuit including a first terminal receiving an excitation voltage, and second and third terminals producing a sensor output voltage therebetween, comprising:

(a) means for producing a linearization current in response to the sensor output voltage;

(b) means for producing a scaled linearization current in response to the linearization current;

(c) means for producing the excitation voltage by amplifying a band gap voltage; and (d) means for modulating the excitation voltage by producing a bi-directional correction current proportional to the linearization current by conducting the scaled linearization current into a feedback circuit of an amplifier while a polarity control signal is at a first level, and by conducting a mirrored image of the scaled linearization current out of the feedback circuit if the polarity control signal is at a second level, to cause the amplifier to produce the excitation voltage equal to the band gap voltage plus or minus a positive or negative correction, respectively, according to the level of the polarity control signal and according to the magnitude of the sensor output voltage.

* * * * *